United States Patent
Pawar et al.

(10) Patent No.: US 9,516,784 B2
(45) Date of Patent: Dec. 6, 2016

(54) ELECTRICAL SWITCHGEAR SYSTEM

(71) Applicants: Rahul Pawar, Lake Mary, FL (US);
 Rob S Karnbach, Lake Mary, FL (US)

(72) Inventors: Rahul Pawar, Lake Mary, FL (US);
 Rob S Karnbach, Lake Mary, FL (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/625,330

(22) Filed: Feb. 18, 2015

(65) Prior Publication Data
 US 2016/0242315 A1 Aug. 18, 2016

(51) Int. Cl.
 *H05K 7/20* (2006.01)
 *G06F 1/20* (2006.01)

(52) U.S. Cl.
 CPC ................ *H05K 7/20145* (2013.01)

(58) Field of Classification Search
 CPC ............ H05K 7/20; G06F 1/20; H02B 1/56; H02B 13/00; H02B 13/01; H02B 13/025; H02B 1/00; H01H 9/52
 USPC ........ 361/601, 605, 611, 619–621, 623–626, 361/637, 638, 641, 675–679, 690–696; 312/223.2, 223.3; 200/50.21–50.27, 306; 218/155, 157; 454/184
 See application file for complete search history.

(56) References Cited

U.S. PATENT DOCUMENTS

| | | | | |
|---|---|---|---|---|
| 4,118,755 A | * | 10/1978 | Davies | H02B 1/56 174/16.1 |
| 4,528,614 A | | 7/1985 | Shariff et al. | |
| 5,124,881 A | | 6/1992 | Motoki | |
| 5,574,624 A | * | 11/1996 | Rennie | H02B 13/025 200/289 |
| 5,892,195 A | * | 4/1999 | Aufermann | H02B 13/025 218/157 |
| 7,586,738 B1 | | 9/2009 | Hartzel et al. | |
| 7,952,857 B1 | * | 5/2011 | Motley | H02B 13/025 361/678 |
| 8,189,325 B2 | * | 5/2012 | Kurogi | H02B 13/01 218/157 |
| 8,791,361 B2 | * | 7/2014 | Gingrich | H02B 1/565 174/17 VA |

* cited by examiner

*Primary Examiner* — Michail V Datskovskiy
(74) *Attorney, Agent, or Firm* — Taft Stettinius & Hollister LLP

(57) ABSTRACT

An electrical switchgear system includes a first compartment supplied with cooling air and in fluid communication with an exhaust plenum. A second compartment is in fluid communication with the exhaust plenum. A deflector is operative to deflect an amount of the cooling air from the first compartment and direct it into the second compartment. An electrical switchgear system having switchgear in an enclosure includes a first compartment disposed inside the enclosure and supplied with cooling air. A second compartment is disposed inside the enclosure. A deflector is operative to capture an amount of the cooling air from the first compartment and direct it into the second compartment.

19 Claims, 2 Drawing Sheets

US 9,516,784 B2

ELECTRICAL SWITCHGEAR SYSTEM

FIELD OF THE INVENTION

The present disclosure relates to electrical systems, and more particularly to electrical switchgear and the cooling of electrical switchgear components.

BACKGROUND

Electrical switchgear systems remain an area of interest. Some existing systems have various shortcomings, drawbacks and disadvantages relative to certain applications. For example, in some electrical switchgear systems, electrical components in some compartments may not receive as much cooling air flow as desired in certain applications. Accordingly, there remains a need for further contributions in this area of technology.

SUMMARY

A unique electrical switchgear system includes a first compartment supplied with cooling air and in fluid communication with an exhaust plenum. A second compartment is in fluid communication with the exhaust plenum. A deflector is operative to deflect an amount of the cooling air from the first compartment and direct it into the second compartment. A unique electrical switchgear system having switchgear in an enclosure includes a first compartment disposed inside the enclosure and supplied with cooling air. A second compartment is disposed inside the enclosure. A deflector is operative to capture an amount of the cooling air from the first compartment and direct it into the second compartment.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
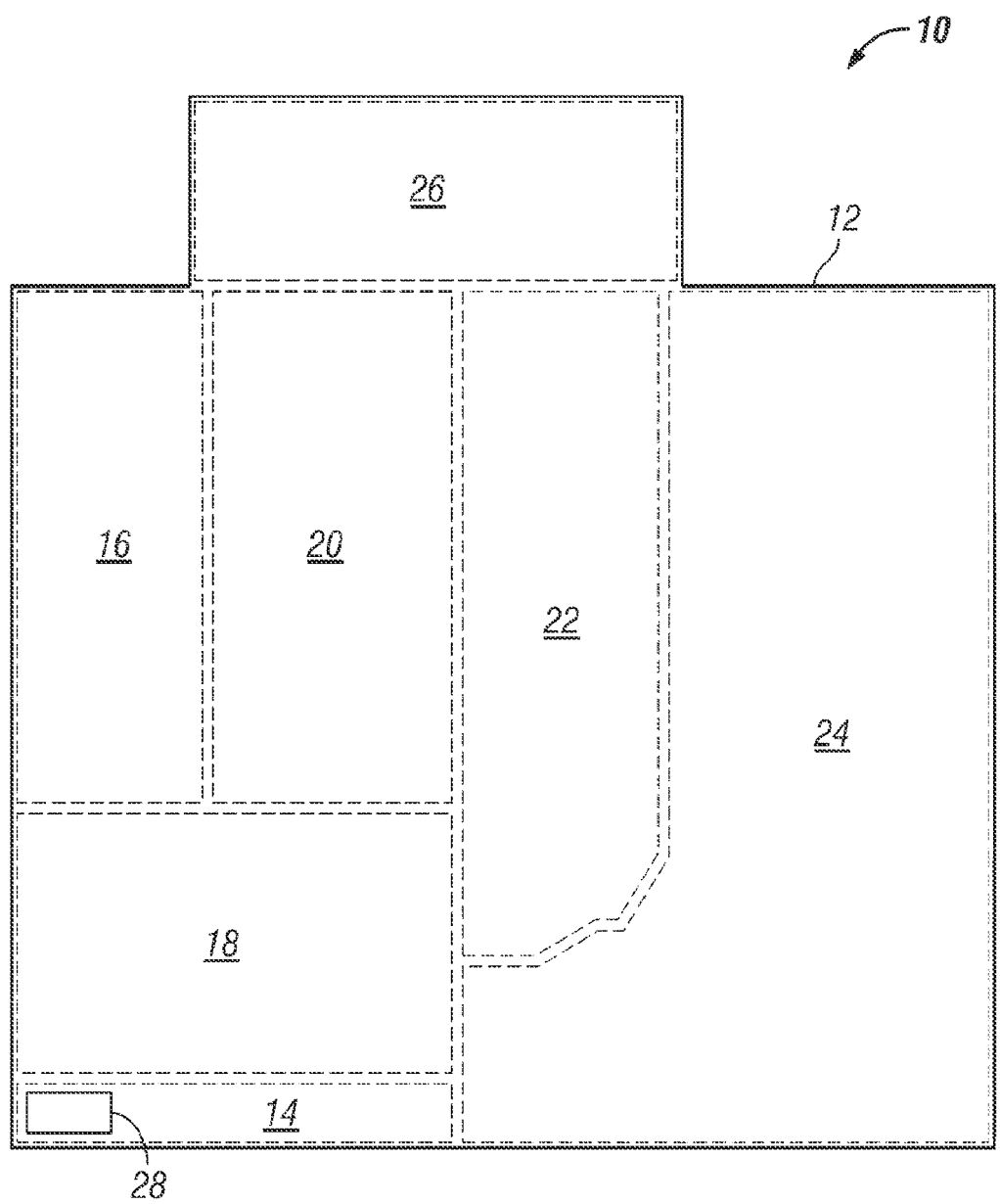
FIG. 1 schematically depicts some aspects of an electrical switchgear system in accordance with a non-limiting example of an embodiment of the present invention.

For purposes of promoting an understanding of the principles of the invention, reference will now be made to the embodiments illustrated in the drawings, and specific language will be used to describe the same. It will nonetheless be understood that no limitation of the scope of the invention is intended by the illustration and description of certain embodiments of the invention. In addition, any alterations and/or modifications of the illustrated and/or described embodiment(s) are contemplated as being within the scope of the present invention. Further, any other applications of the principles of the invention, as illustrated and/or described herein, as would normally occur to one skilled in the art to which the invention pertains, are contemplated as being within the scope of the present invention.

Referring to FIG. 1, some aspects of a non-limiting example of an electrical switchgear system 10 in accordance with an embodiment of the present invention are schematically depicted. Electrical switchgear system 10 includes an enclosure 12. System 10 and enclosure 12 include a vent box 14, a low voltage compartment 16, a circuit breaker compartment 18, a vent chamber or compartment 20, a main bus compartment 22, a cable compartment 24, an exhaust plenum 26 and a fan 28. In various embodiments, system 10 and enclosure 12 may contain a greater or lesser number of compartments than those illustrated and mentioned herein. Fan 28 is operative to supply air to vent box 14, for distribution to circuit breaker compartment 18 and convective cooling of electrical components located within circuit breaker compartment 18. In some embodiments, fan 28 may be disposed in other locations than that illustrated, e.g., including inside of or downstream of plenum 26, inside or downstream of vent chamber 20, at the top of a chimney, or at any location upstream or downstream of the volume defined by vent chamber 20, etc. In some embodiments, one or more fans may be disposed both upstream and downstream of vent chamber 20. In other embodiments, natural convention cooling may be used in addition to or in place of forced convection cooling. Various embodiments may or may not include fan 28. In addition, various embodiments may or may not include plenum 26.

The cooling air received into and used for cooling in circuit breaker compartment 18 is exhausted to vent chamber 20. Some of this air exhausted into vent chamber 20 from circuit breaker compartment 18 is supplied to main bus compartment 22, e.g., as described herein, the amount of which may vary according to the needs of the particular application. The balance of the cooling air leaving circuit breaker compartment 18 is exhausted from vent chamber 20, e.g., into plenum 26 for embodiments so configured. The cooling air supplied to main bus compartment 22 from vent chamber or compartment 20 is exhausted, e.g., into plenum 26.

Figure 2:
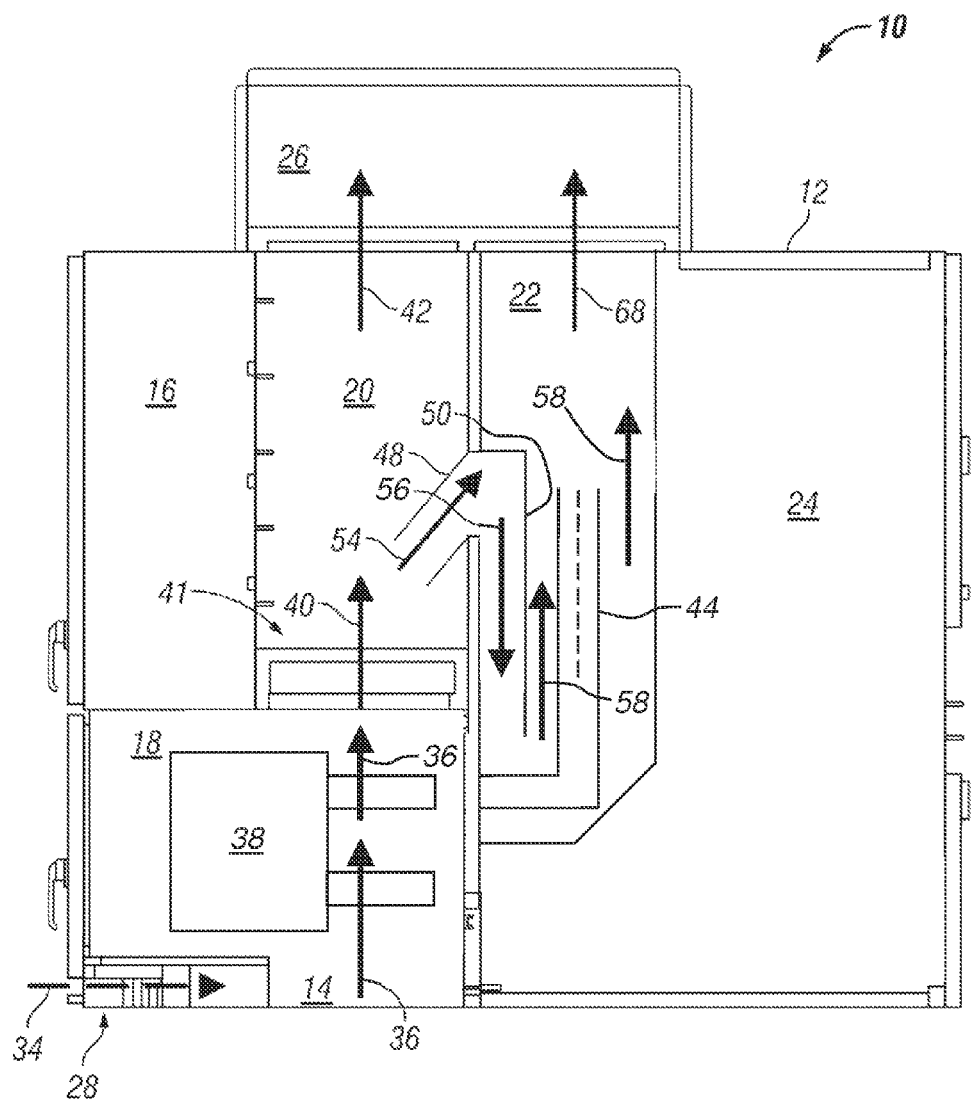
FIG. 2 schematically depicts some aspects of an electrical switchgear system in accordance with a non-limiting example of an embodiment of the present invention.

Referring to FIG. 2, some aspects of a non-limiting example of an electrical switchgear system 10 in accordance with an embodiment of the present invention are schematically depicted. Arrows 34 and 36 represent cooling air supplied from fan 28 via vent box 14 into breaker compartment 18, which is used to cool circuit breakers and/or related electrical equipment and connections 38 in breaker compartment 18. Arrow 40 represents cooling air that has cooled circuit breakers and related electrical equipment and connections 38 in breaker compartment 18, which is subsequently discharged into vent chamber 20. Circuit breaker compartment 18 exhausts the cooling air to vent chamber 20 via a normally open flap system 41. Flap system 41 is configured to close in response to an arc event in circuit breaker compartment 18. Arrow 42 represents the cooling air that is exhausted to or discharged from vent chamber 20, e.g., into plenum 26.

Disposed within main bus compartment 22 are electrical components 44, such as a plurality of bus bars and a plurality of bus bar joints. Electrical switchgear system includes a passage 48 that is operative to capture cooling air from vent chamber 20 and direct it into main bus compartment 22. In one form, passage 48 is a deflector or scoop. In other embodiments, passage 48 make take one or more of a plurality of other forms, depending on the needs of the particular application, e.g., a simple opening, or any form of opening or passage as between two compartments, adjacent to each other or otherwise. In some embodiments, main bus compartment 22 operates at a lower static pressure than vent compartment 20, e.g., owing to a lower static pressure in plenum 26 at the location on plenum 26 where main bus compartment 26 is exposed to plenum 26, thus allowing cooling air to be drawn into main bus compartment via a passage 48 in the form of a simple opening, due to the pressure differential. In other embodiments, passage 48, in the form a deflector or scoop, may take the form of one or more deflectors or ram scoops that deflect and capture flow based on its dynamic pressure, and transmit the cooling air flow from vent compartment 20 into main bus compartment 22, without regard to whether the static pressure in main bus compartment 22 is lower than the static pressure in vent chamber or compartment 20. In some embodiments, deflector 48 may be sized to partially block or reduce the flow area through vent compartment 20 to a sufficient degree to thereby form a pressure differential between vent compartment 20 and main bus compartment 22 to divert cooling air flow into main bus chamber 22 via passage 48.

In some embodiments, passage 48 includes an extension 50 operative to drive the captured cooling air in a direction 56 opposite to the bulk flow direction 40 of the cooling air flow in vent chamber 20. In some such embodiments, extension 50 may drive the cooling air flow downward toward the bottom of main bus compartment 22. In some embodiments, one or more vent flaps or cross flap systems, e.g., normally open, may be employed within or adjacent to one or both of passage 48 and extension 50 in order to prevent outflow or backflow upon the occurrence of an arc event.

The cooling air driven into main bus chamber 22 is indicated by arrows 54 and 56. After being driven downward toward the bottom of main bus compartment 22 by deflector 48 with extension 50, the air turns and flows upward, as indicated by arrows 58, along electrical components 44, thereby extracting heat from and cooling electrical components 44. The cooling air then exits main bus compartment 22 upwards into plenum 26, as indicated by arrow 68, after performing the mentioned cooling.

It will be understood that any compartment or chamber within or without enclosure 12 may be cooled using a same or similar scheme disclosed and described herein, whether such compartment is adjacent to the compartment(s) providing the cooling air or not. For example, internal or external tubing, piping, conduits, formed channels or the like may be employed to transmit cooling air from any chamber or compartment to any other chamber or compartment using a deflector or scoop such as deflector 48, with or without extension 40, without departing from the scope of the present invention.

Embodiments of the present invention include an electrical switchgear system, comprising: a first compartment supplied with cooling air and in fluid communication with an exhaust plenum; a second compartment in fluid communication with the exhaust plenum; and a deflector operative to capture an amount of the cooling air from the first compartment and direct it into the second compartment.

In a refinement, the electrical switchgear system further comprises a third compartment having electrical components therein, wherein the cooling air cools the electrical components in the third compartment prior to entering the first compartment.

In another refinement, the first compartment is a vent chamber, and the second compartment is a main bus compartment adjacent to the vent chamber.

In yet another refinement, the electrical switchgear system further comprises a bus bar disposed in the second compartment, wherein the deflector and the second compartment are constructed to direct the amount of the cooling air from the first compartment to cool the bus bar.

In still another refinement, the electrical switchgear system further comprises a bus bar joint disposed in the second compartment, wherein the deflector and the second compartment are constructed to direct the amount of the cooling air from the first compartment to cool the bus bar joint.

In yet still another refinement, the deflector is at least partially disposed within the first compartment.

In a further refinement, the deflector includes an extension disposed within the second compartment, and the extension is operative to drive the cooling air flow in a direction different than a direction of flow of the cooling air in the first compartment.

In a yet further refinement, the deflector is operative to drive the cooling air flow into the second compartment in a direction opposite to a direction of flow of the cooling air in the first compartment.

Embodiments of the present invention include an electrical switchgear system having switchgear in an enclosure, comprising: a first compartment disposed inside the electrical switchgear system enclosure and supplied with cooling air; a second compartment disposed inside the electrical switchgear system enclosure; and a deflector operative to deflect an amount of the cooling air from the first compartment and direct it into the second compartment In a refinement, the deflector is at least partially disposed within the first compartment.

In another refinement, the deflector is operative to drive the cooling air flow into the second compartment in a direction opposite to the direction of flow of the cooling air in the first compartment.

In yet another refinement, the second compartment has a lower static pressure than the first compartment.

In still another refinement, the electrical switchgear system further comprises a bus bar joint disposed in the second compartment, wherein the deflector and the second compartment are constructed to direct the amount of the cooling air from the first compartment to cool the bus bar joint.

In yet still another refinement, the first compartment is a vent chamber, and the second compartment is a main bus compartment adjacent to the vent chamber.

In a further refinement, the electrical switchgear system further comprises a circuit breaker compartment and a circuit breaker disposed therein, wherein the circuit breaker compartment is adjacent to the vent chamber; and wherein the cooling air cools the circuit breaker prior to being exhausted from the circuit breaker compartment into the vent chamber.

In a yet further refinement, the deflector includes an extension disposed within the second compartment.

In a still further refinement, the extension is operative to drive the cooling air flow in a direction different than a direction of flow of the cooling air in the first compartment.

In a yet still further refinement, the electrical switchgear system further comprises a fan, wherein the fan is operative to supply the first compartment with the cooling air.

In yet another refinement, the electrical switchgear system further comprises a bus bar disposed in the second compartment, wherein the deflector and the second compartment are constructed to direct the amount of the cooling air from the first compartment to cool the bus bar.

Embodiments of the present invention include an electrical switchgear system, comprising: a first compartment in fluid communication with a cooling air supply; a second compartment; and means for supplying cooling air to the second compartment from the first compartment.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

What is claimed is:

1. An electrical switchgear system, comprising:
    a first compartment supplied with cooling air and in fluid communication with an exhaust plenum;
    a second compartment in fluid communication with the exhaust plenum; and
    a deflector operative to deflect an amount of the cooling air from the first compartment and direct it into the second compartment.

2. The electrical switchgear system of claim 1, further comprising a third compartment having electrical components therein, wherein the cooling air cools the electrical components in the third compartment prior to entering the first compartment.

3. The electrical switchgear system of claim 1, wherein the first compartment is a vent chamber, and wherein the second compartment is a main bus compartment adjacent to the vent chamber.

4. The electrical switchgear system of claim 1, further comprising a bus bar disposed in the second compartment, wherein the deflector and the second compartment are constructed to direct the amount of the cooling air from the first compartment to cool the bus bar.

5. The electrical switchgear system of claim 1, further comprising a bus bar joint disposed in the second compartment, wherein the deflector and the second compartment are constructed to direct the amount of the cooling air from the first compartment to cool the bus bar joint.

6. The electrical switchgear system of claim 1, wherein the deflector is at least partially disposed within the first compartment.

7. The electrical switchgear system of claim 6, wherein the deflector includes an extension disposed within the second compartment, and wherein the extension is operative to drive the cooling air flow in a direction different than a direction of flow of the cooling air in the first compartment.

8. The electrical switchgear system of claim 1, wherein the deflector is operative to drive the cooling air flow into the second compartment in a direction opposite to a direction of flow of the cooling air in the first compartment.

9. An electrical switchgear system having switchgear in an enclosure, comprising:
    a first compartment disposed inside the electrical switchgear system enclosure and supplied with cooling air;
    a second compartment disposed inside the electrical switchgear system enclosure; and
    a deflector operative to capture an amount of the cooling air from the first compartment and direct it into the second compartment.

10. The electrical switchgear system of claim 9, wherein the deflector is at least partially disposed within the first compartment.

11. The electrical switchgear system of claim 9, wherein the deflector is operative to drive the cooling air flow into the second compartment in a direction opposite to the direction of flow of the cooling air in the first compartment.

12. The electrical switchgear system of claim 9, wherein the second compartment has a lower static pressure than the first compartment.

13. The electrical switchgear system of claim 9, further comprising a bus bar joint disposed in the second compartment, wherein the deflector and the second compartment are constructed to direct the amount of the cooling air from the first compartment to cool the bus bar joint.

14. The electrical switchgear system of claim 9, wherein the first compartment is a vent chamber, and wherein the second compartment is a main bus compartment adjacent to the vent chamber.

15. The electrical switchgear system of claim 14, further comprising a circuit breaker compartment and a circuit breaker disposed therein, wherein the circuit breaker compartment is adjacent to the vent chamber; and wherein the cooling air cools the circuit breaker prior to being exhausted from the circuit breaker compartment into the vent chamber.

16. The electrical switchgear system of claim 9, wherein the deflector includes an extension disposed within the second compartment.

17. The electrical switchgear system of claim 16, wherein the extension is operative to drive the cooling air flow in a direction different than a direction of flow of the cooling air in the first compartment.

18. The electrical switchgear system of claim 17, further comprising a fan, wherein the fan is operative to supply the first compartment with the cooling air.

19. The electrical switchgear system of claim 9, further comprising a bus bar disposed in the second compartment, wherein the deflector and the second compartment are constructed to direct the amount of the cooling air from the first compartment to cool the bus bar.

* * * * *